United States Patent
Nakamura

(10) Patent No.: US 9,312,297 B2
(45) Date of Patent: Apr. 12, 2016

(54) SEMICONDUCTOR APPARATUS AND ELECTRONIC APPARATUS

(71) Applicant: Sony Corporation, Tokyo (JP)

(72) Inventor: Takuya Nakamura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 83 days.

(21) Appl. No.: 14/091,698

(22) Filed: Nov. 27, 2013

(65) Prior Publication Data

US 2014/0159186 A1    Jun. 12, 2014

(30) Foreign Application Priority Data

Dec. 6, 2012   (JP) ................................. 2012-267398

(51) Int. Cl.
*H01L 27/146* (2006.01)
*H01L 23/00* (2006.01)

(52) U.S. Cl.
CPC .......... *H01L 27/14643* (2013.01); *H01L 24/73* (2013.01); *H01L 27/14625* (2013.01); *H01L 2224/16145* (2013.01); *H01L 2224/32145* (2013.01); *H01L 2224/48091* (2013.01); *H01L 2224/73204* (2013.01)

(58) Field of Classification Search
CPC ................................................ H01L 31/02164
USPC ............. 257/435, 59, 72, E27.13; 250/208.1; 348/372, 374, 308, E05.091
See application file for complete search history.

(56) References Cited

U.S. PATENT DOCUMENTS

2011/0254988 A1*  10/2011  Itakura et al. ................. 348/308
2012/0211852 A1*  8/2012  Iwafuchi et al. .............. 257/435

FOREIGN PATENT DOCUMENTS

JP   2012-124305      6/2012
JP   2012124305  A  *  6/2012

OTHER PUBLICATIONS

English machine translation of JP 2012124305 A.*

* cited by examiner

*Primary Examiner* — Cuong Q Nguyen
*Assistant Examiner* — Tong-Ho Kim
(74) *Attorney, Agent, or Firm* — Michael Best & Friedrich LLP

(57) ABSTRACT

A semiconductor apparatus includes a first semiconductor chip, a second semiconductor chip, and a flare prevention plate. On the first semiconductor chip, a photoelectric conversion unit configured to perform photoelectric conversion on light received in a light receiving area is formed. The second semiconductor chip is electrically connected to the first semiconductor chip, the second semiconductor chip being disposed on a surface of the first semiconductor chip on a side of the light receiving area. The flare prevention plate is disposed on the second semiconductor chip, the flare prevention plate being configured to block light, the flare prevention plate being in contact with the second semiconductor chip.

6 Claims, 8 Drawing Sheets

SEMICONDUCTOR APPARATUS AND ELECTRONIC APPARATUS

CROSS REFERENCE TO RELATED APPLICATIONS

This application claims the benefit of Japanese Priority Patent Application JP 2012-267398 filed Dec. 6, 2012, the entire contents of which are incorporated herein by reference.

BACKGROUND

The present disclosure relates to a semiconductor apparatus and an electronic apparatus, and particularly to a small-sized sophisticated semiconductor apparatus capable of reducing noise of an image and performing arithmetic processing at high speed, and to an electronic apparatus including the small-sized sophisticated semiconductor apparatus.

To a semiconductor package including an image sensor chip, a countermeasure against stray light caused due to the leakage of unnecessary light in a light receiving area of the image sensor chip has been applied in the past.

In particular, because metal that reflects light easily is often used for a bonding wire connecting an image sensor chip and a package substrate, there is a need to apply a countermeasure against stray light to the bonding wire. Therefore, in order to prevent the light reflected by the bonding wire from leaking in the light receiving area of the image sensor chip, a flare prevention plate has been provided in the past.

Moreover, in recent years, with size reduction and improved performance of an electronic apparatus, a semiconductor package including an image sensor chip is expected to have higher performance. For example, there is a need for a semiconductor package capable of performing arithmetic processing at higher speed than an existing semiconductor package.

On the other hand, in recent years, refinement of the process of a semiconductor chip has proceeded, and a semiconductor chip produced by a new generation of process capable of increasing the number of transistors to be integrated per unit area (referred to as a new-generation semiconductor chip) has been widely used.

By using such a new-generation semiconductor chip, it is possible to increase in speed of arithmetic processing to be higher than that of an existing semiconductor chip, and to reduce power consumption. Therefore, a semiconductor package including a new-generation semiconductor chip as a peripheral circuit unit, which has been incorporated in an image sensor chip in the past, has been produced.

However, because the new-generation semiconductor chip that performs arithmetic processing at high speed has a high amount of heat generation, there is a need to apply a countermeasure against heat dissipation to the new-generation semiconductor chip.

For example, a technology to transfer heat generated from a semiconductor chip to a package substrate by providing a heat conductive member that thermally couples the semiconductor chip and the package substrate together has been proposed (see, for example, Japanese Patent Application Laid-open No. 2012-124305).

SUMMARY

In the semiconductor package including the new-generation semiconductor chip as a peripheral circuit unit, however, light reflected by the new-generation semiconductor chip serving as the peripheral circuit unit leaks in the light receiving area of the image sensor chip in some cases.

A sufficient countermeasure against stray light according to such a new-generation semiconductor chip serving as the peripheral circuit unit is not applied in related art, and a ghost due to stray light is generated in some cases.

In view of the above circumstances, the present disclosure has been made, and it is desirable to provide a semiconductor apparatus including a small-sized sophisticated image sensor, which is capable of reducing noise of an image and performing arithmetic processing at high speed.

According to a first embodiment of the present disclosure, there is provided a semiconductor apparatus including a first semiconductor chip on which a photoelectric conversion unit configured to perform photoelectric conversion on light received in a light receiving area is formed, a second semiconductor chip electrically connected to the first semiconductor chip, the second semiconductor chip being disposed on a surface of the first semiconductor chip on a side of the light receiving area, and a flare prevention plate disposed on the second semiconductor chip, the flare prevention plate being configured to block light, the flare prevention plate being in contact with the second semiconductor chip.

An end portion of the flare prevention plate on a side of the light receiving area may be disposed so as to protrude from an end portion of the second semiconductor chip on a side of the light receiving area by not less than 200 μm.

An end portion of the flare prevention plate on a side of the light receiving area may be bent obliquely downward.

An end portion of the flare prevention plate on a side of the light receiving area may be bent downward at a right angle.

A film of one of heat dissipating resin and a conductor for heat dissipation may be formed on a surface of the flare prevention plate on a side where the flare prevention plate is in contact with the second semiconductor chip.

According to a second embodiment of the present disclosure, there is provided an electronic apparatus, including a semiconductor apparatus including a first semiconductor chip on which a photoelectric conversion unit configured to perform photoelectric conversion on light received in a light receiving area is formed, a second semiconductor chip electrically connected to the first semiconductor chip, the second semiconductor chip being disposed on a surface of the first semiconductor chip on a side of the light receiving area, and a flare prevention plate disposed on the second semiconductor chip, the flare prevention plate being configured to block light, the flare prevention plate being in contact with the second semiconductor chip.

In the first and second embodiments of the present disclosure, on a second semiconductor chip disposed on a surface of a first semiconductor chip on a side of a light receiving area, which is electrically connected to the first semiconductor chip on which a photoelectric conversion unit configured to perform photoelectric conversion on light received in the light receiving area is formed, a flare prevention plate configured to block light is disposed, and the flare prevention plate is in contact with the second semiconductor chip.

According to the present disclosure, it is possible to provide a semiconductor apparatus including a small-sized sophisticated image sensor, which is capable of reducing noise of an image and performing arithmetic processing at high speed.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
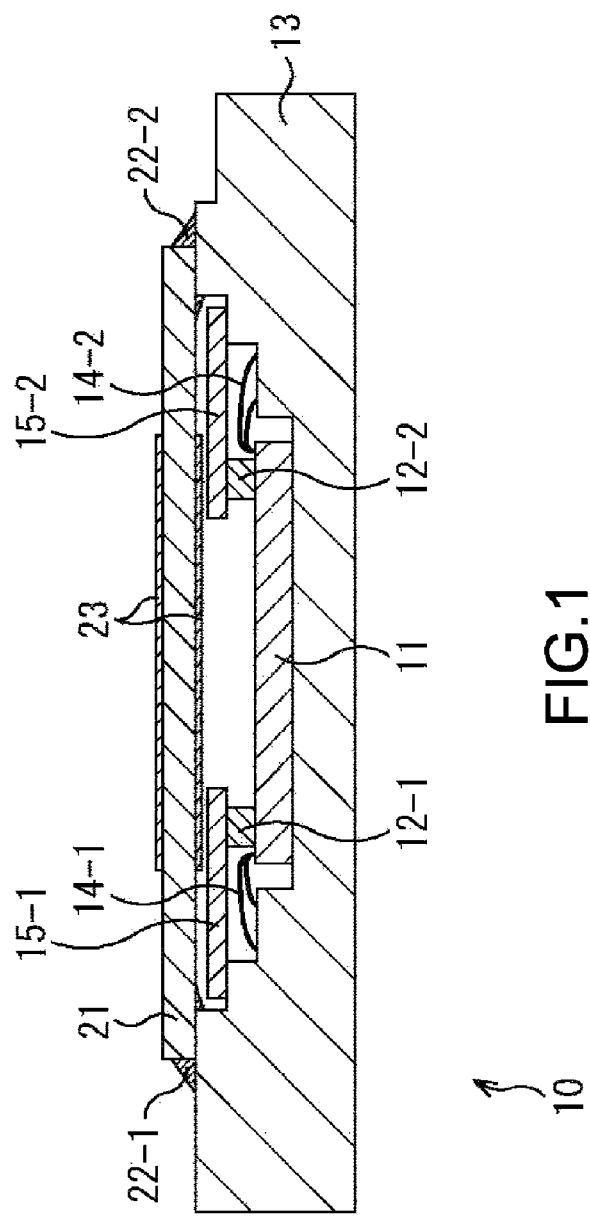
FIG. 1 is a cross-sectional view showing a configuration example of a semiconductor apparatus according to an embodiment of the present disclosure.

FIG. 1 is a cross-sectional view showing a configuration example of a semiconductor apparatus according to an embodiment of the present disclosure. A semiconductor apparatus 10 shown in FIG. 1 includes a semiconductor package used as a solid-state image sensor, for example.

As shown in FIG. 1, in the semiconductor apparatus 10, an image sensor chip 11 is disposed on a package substrate 13. The image sensor chip 11 has a light receiving area for performing photoelectric conversion on received light. It should be noted that the light receiving area is provided on the upper side of the image sensor chip 11 in FIG. 1, and the upper side surface in FIG. 1 is a light-receiving surface of the image sensor chip 11.

Moreover, in the semiconductor apparatus 10, a logic chip 12-1 and a logic chip 12-2 are disposed on the image sensor chip 11. The logic chip 12-1 and the logic chip 12-2 are each a semiconductor chip including a peripheral circuit such as a vertical drive circuit, a horizontal drive circuit, a control circuit, and a signal processing circuit.

It should be noted that the logic chip 12-1 and the logic chip 12-2 are electrically connected to the image sensor chip 11 by bump processing using soldering or plating, for example.

The logic chip 12-1 and the logic chip 12-2 are electrically connected to the package substrate 13 by a bonding wire 14-1 and a bonding wire 14-2, respectively.

Moreover, on the logic chip 12-1 and the logic chip 12-2, a flare prevention plate 15-1 and a flare prevention plate 15-2 are provided.

The flare prevention plate 15-1 and the flare prevention plate 15-2 prevent light reflected on the logic chip 12-1 and the logic chip 12-2 from leaking in the light receiving area of the image sensor chip 11.

Although the details will be described later, a film of heat dissipating resin or a thermal conductor is formed on the lower surface of each of the flare prevention plate 15-1 and the flare prevention plate 15-2 in FIG. 1, and the flare prevention plate 15-1 and the flare prevention plate 15-2 are disposed so as to be in contact with the logic chip 12-1 and the logic chip 12-2, respectively, and to be in contact with the package substrate 13.

The heat generated by the logic chip 12-1 and the logic chip 12-2 is transferred to the package substrate 13 via the film of heat dissipating resin or a thermal conductor, and is radiated from the package substrate 13.

Furthermore, on the flare prevention plate 15-1 and the flare prevention plate 15-2, a glass plate 21 is disposed. On both surfaces, i.e., upper and lower surfaces in FIG. 1, of the glass plate 21, an AR (Anti Reflection) coating layer 23 is formed.

Moreover, both ends, i.e., right and left ends in FIG. 1, of the glass plate 21 are fixed to the package substrate 13 by a sealing resin 22-1 and a sealing resin 22-2.

In recent years, with size reduction and improved performance of an electronic apparatus, a semiconductor package including an image sensor chip is expected to have higher performance. For example, there is a need for a semiconductor package capable of performing arithmetic processing at higher speed than an existing semiconductor package.

On the other hand, in recent years, refinement of the process of a semiconductor chip has proceeded, and a semiconductor chip produced by a new generation of process capable of increasing the number of transistors to be integrated per unit area (referred to as a new-generation semiconductor chip) has been widely used.

By using such a new-generation semiconductor chip, it is possible to increase in speed of arithmetic processing to be higher than that of an existing semiconductor chip. Therefore, in the semiconductor apparatus 10 to which an embodiment of the present disclosure is applied, the logic chip 12-1 and the logic chip 12-2 serving as a peripheral circuit include the new-generation semiconductor chip.

On the other hand, in the semiconductor apparatus 10 to which the embodiment of the present disclosure is applied, the image sensor chip 11 includes a semiconductor chip produced by an existing producing process (referred to as current-generation semiconductor chip).

As described above, by separating a peripheral circuit unit, which has been incorporated in an image sensor chip in the past, from the image sensor chip and including a new-generation semiconductor chip as the peripheral circuit unit, it is possible to increase in speed of arithmetic processing to be higher than that of the existing semiconductor chip while reducing the cost of the expensive new-generation semiconductor chip. Moreover, because arithmetic processing is performed by the new-generation semiconductor chip, it is possible to reduce the driving voltage and to reduce power consumption.

However, because the new-generation semiconductor chip that performs arithmetic processing at high speed has a high amount of heat generation, there is a need to apply a countermeasure against heat dissipation to the new-generation semiconductor chip.

Therefore, in the present disclosure, the heat generated by the logic chip 12-1 and the logic chip 12-2 is transferred to the package substrate 13 via the flare prevention plate 15-1 and the flare prevention plate 15-2.

In this way, it is possible to perform arithmetic processing at high speed and to sufficiently apply a countermeasure against heat generation.

Moreover, in the case where a peripheral circuit unit is separated from an image sensor chip and a new-generation semiconductor chip is included as the peripheral circuit unit, as shown in FIG. 1, the logic chip 12-1 and the logic chip 12-2 are disposed on the image sensor chip 11 to reduce the area of the circuit. Specifically, the logic chip 12-1 and the logic chip 12-2 are three-dimensionally disposed on and electrically connected to the image sensor chip 11.

In the case where such a configuration is employed, because the peripheral circuit is not provided in the image sensor chip 11, the length of the chip is short as compared with the image sensor chip including the peripheral circuit. In the example shown in FIG. 1, the length of the image sensor chip 11 in the right and left directions in FIG. 1 is shortened, and the distance between both ends of the image sensor chip 11 in the right and left directions in FIG. 1 and the light receiving area is shortened. As a result, because the distance between the logic chips 12-1 and 12-2 and the light receiving area is shortened, there is a need to sufficiently apply a countermeasure against stray light caused due to light reflected by the logic chips 12-1 and 12-2.

Therefore, in the present disclosure, the flare prevention plate 15-1 and the flare prevention plate 15-2 are provided on the logic chip 12-1 and the logic chip 12-2, respectively. In this way, it is possible to prevent light reflected by the logic chip 12-1 and the logic chip 12-2 from leaking in the light receiving area of the image sensor chip 11.

The configuration of the semiconductor apparatus 10 to which the embodiment of the present disclosure is applied will be described with reference to FIGS. 2 to 4 while referring to the producing process.

Figure 2:
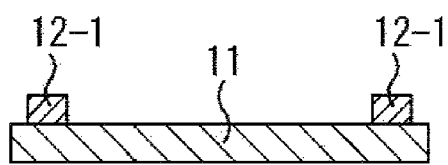
FIG. 2 is a diagram for explaining the structure of a semiconductor apparatus to which the embodiment of the present disclosure is applied with reference to the producing process.

First, as shown in FIG. 2, the logic chip 12-1 and the logic chip 12-2 are mounted on the image sensor chip 11.

As described above, the light receiving area for performing photoelectric conversion on received light is provided on the image sensor chip 11. It should be noted that the light receiving area is provided in the vicinity of the center of the image sensor chip 11 in the upper side in FIG. 2, and the upper side surface in FIG. 2 is the light-receiving surface of the image sensor chip 11.

Therefore, the logic chip 12-1 and the logic chip 12-2 are provided at the left and right end portions of the image sensor chip 11 in FIG. 2, respectively, to avoid the light receiving area, for example. It should be noted that as described above, the logic chip 12-1 and the logic chip 12-2 are electrically connected to the image sensor chip 11 by bump processing using soldering or plating, for example.

Figure 3:
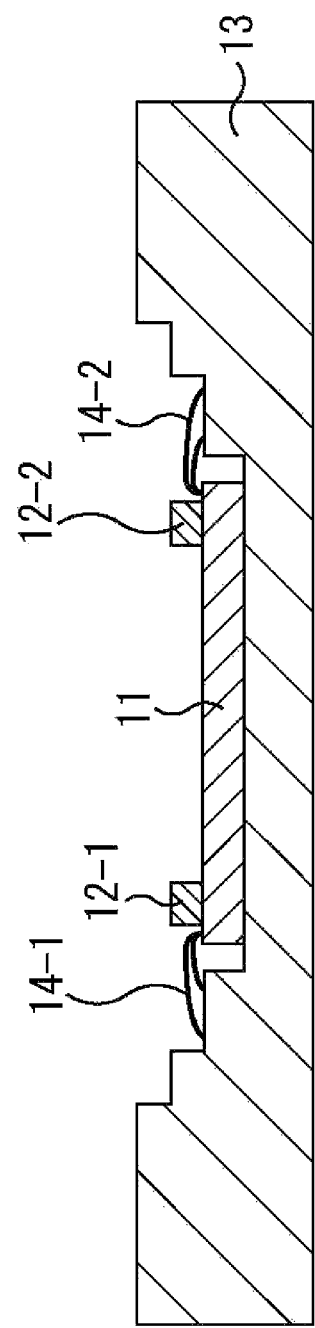
FIG. 3 is a diagram for explaining the structure of a semiconductor apparatus to which the embodiment of the present disclosure is applied with reference to the producing process.

As shown in FIG. 3, the image sensor chip 11 on which the logic chip 12-1 and the logic chip 12-2 are mounted is disposed on the package substrate 13. Then, the logic chip 12-1 and the logic chip 12-2 are electrically connected to the package substrate 13 by the bonding wire 14-1 and the bonding wire 14-2, respectively.

Figure 4:
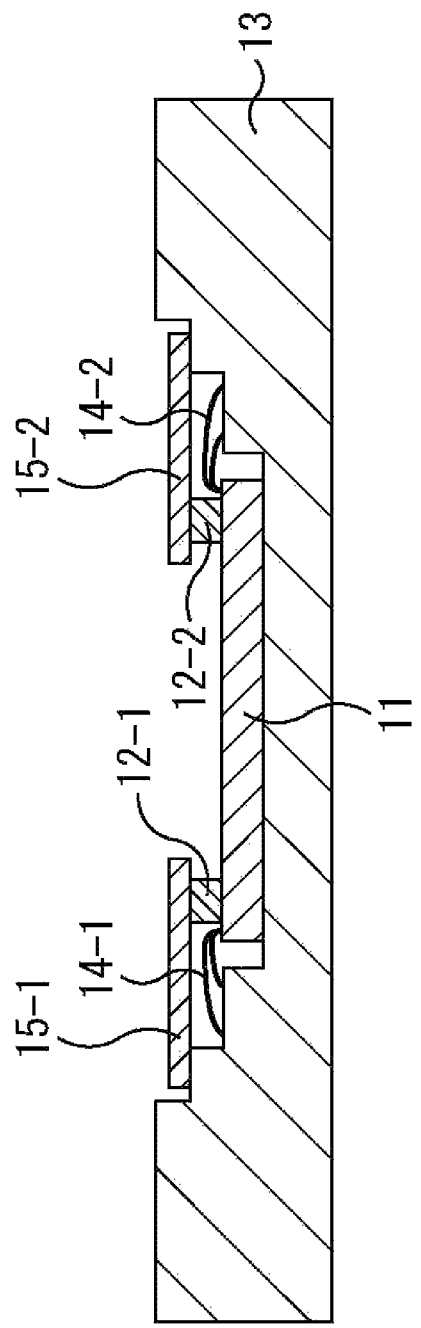
FIG. 4 is a diagram for explaining the structure of a semiconductor apparatus to which the embodiment of the present disclosure is applied with reference to the producing process.

Furthermore, as shown in FIG. 4, on the logic chip 12-1 and the logic chip 12-2, the flare prevention plate 15-1 and the flare prevention plate 15-2 are disposed respectively.

On the lower surfaces of the flare prevention plate 15-1 and the flare prevention plate 15-2 in FIG. 4, a film of heat dissipating resin or a thermal conductor is formed, and the flare prevention plates 15-1 and 15-2 are disposed so as to connect to the logic chip 12-1 and the logic chip 12-2, respectively, and to the package substrate 13.

Figure 5:
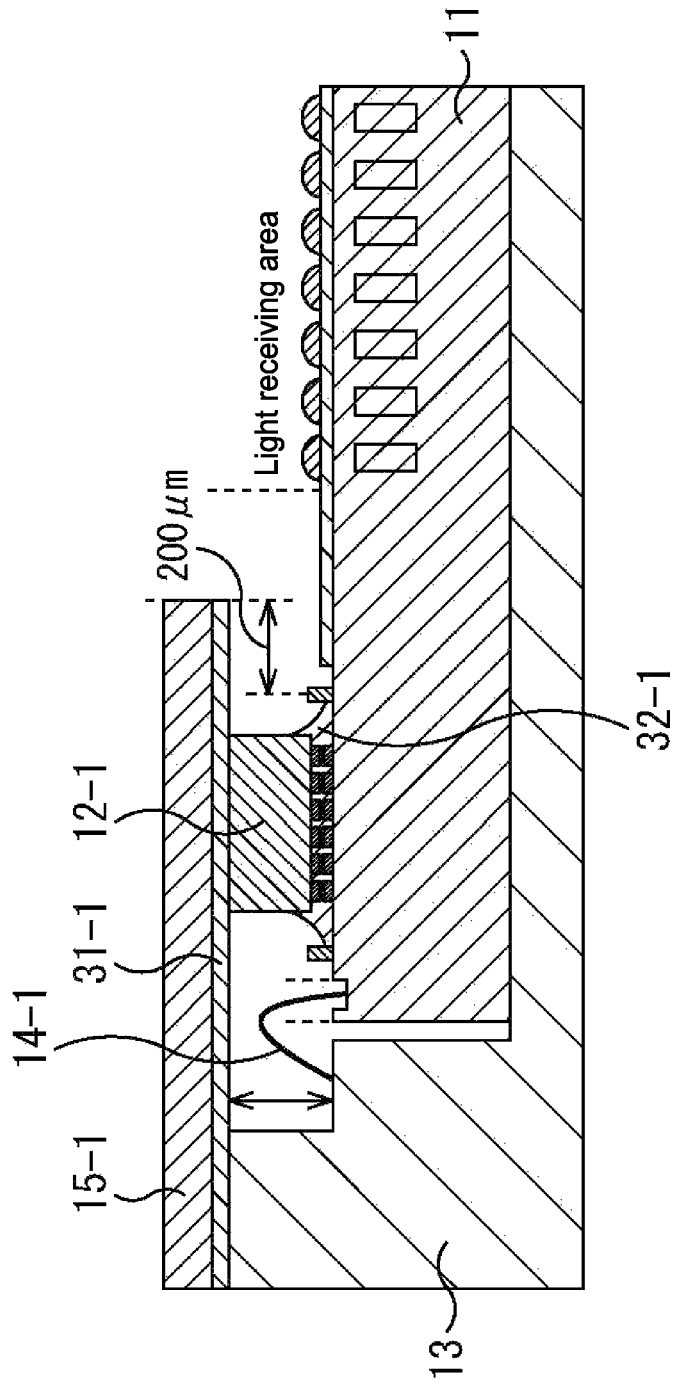
FIG. 5 is a diagram showing an enlarged configuration of the left portion of FIG. 4.

FIG. 5 is a diagram showing an enlarged configuration of the left portion of FIG. 4. As shown in FIG. 5, on the lower surface of the flare prevention plate 15-1 in FIG. 5 on the side coming into contact with the logic chip 12-1, a film 31-1 of heat dissipating resin or a thermal conductor is formed. It should be noted that although not shown in FIG. 5, on the lower surface of the flare prevention plate 15-2 on the side coming into contact with the logic chip 12-2, a film 31-2 of heat dissipating resin or a thermal conductor is formed similarly.

Then, at the left end portion of the flare prevention plate 15-1 in FIG. 5, the lower film 31-1 of the flare prevention plate 15-1 is in contact with a part of the package substrate 13. In this way, the heat generated by the logic chip 12-1 is transferred to the package substrate 13 via the film 31-1, and is radiated from the package substrate 13.

Moreover, an underfill material (sealing resin) 32-1 is inserted into the contact surface between the logic chip 12-1 and the image sensor chip 11.

Because the flare prevention plate 15-1 prevents light from reflecting by the logic chip 12-1, the flare prevention plate 15-1 is disposed so as to protrude from the end portion of the logic chip 12-1 on the side of the light receiving area (right side in FIG. 5) by about 200 μm, for example. It should be noted that in the example in FIG. 5, the end portion of the logic chip 12-1 on the side of the light receiving area corresponds to the right end portion of the underfill material 32-1 in FIG. 5. It should be noted that although not shown in FIG. 5, the flare prevention plate 15-2 is disposed so as to protrude from the end portion of the logic chip 12-2 on the side of the light receiving area to the side of the light receiving area by about 200 μm, similarly.

In this way, it is possible to prevent light incident from the upper side in FIG. 5 from being applied to the logic chip 12-1, and to reliably prevent light from reflecting by the logic chip 12-1.

Figure 6:
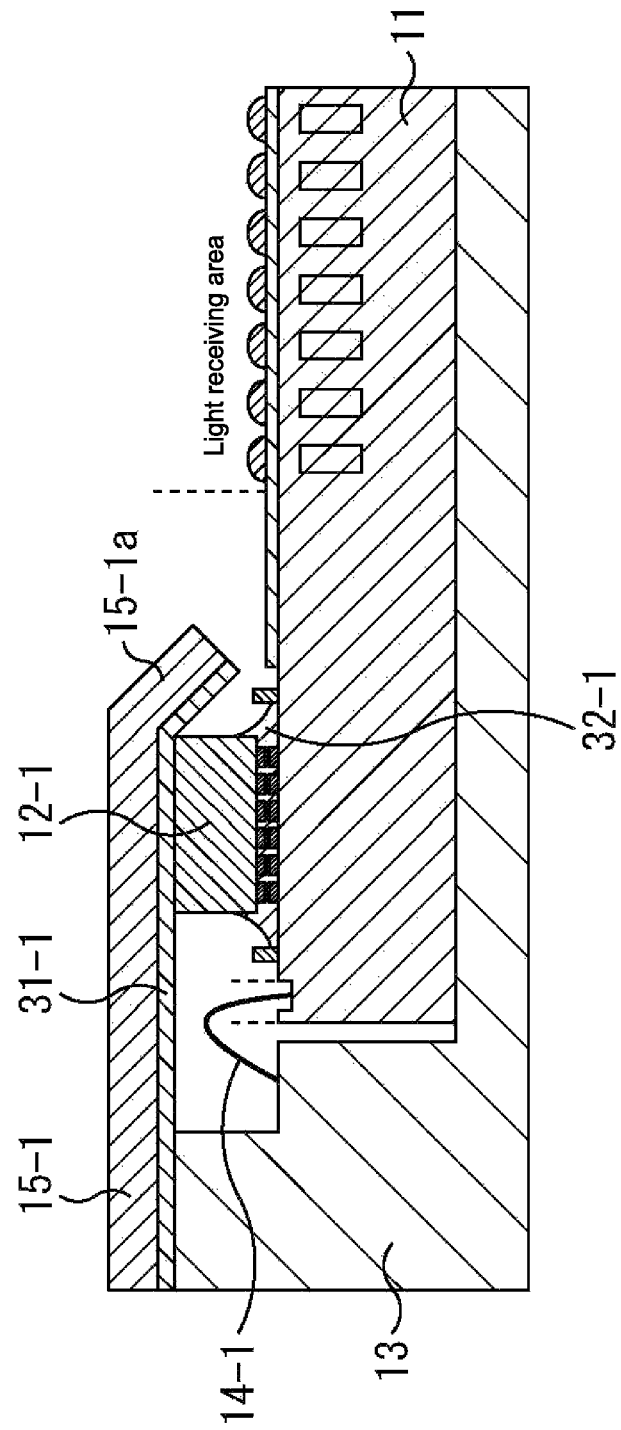
FIG. 6 is a diagram showing another enlarged configuration of the left portion of FIG. 4.

Alternatively, the flare prevention plate 15-1 and the flare prevention plate 15-2 may be disposed as shown in FIG. 6.

In the example shown in FIG. 6, an end portion 15-1a of the flare prevention plate 15-1 on the side of the light receiving area (right side in FIG. 6) is bent obliquely downward in FIG. 6. The configurations of other portions in FIG. 6 are same as those described above with reference to FIG. 5.

It should be noted that in this case, the end portion of the flare prevention plate 15-2 on the side of the light receiving area is bent obliquely downward in FIG. 6, similarly.

In this way, it is possible to prevent light incident from the upper side in FIG. 6 from being applied to the logic chip 12-1 more reliably, and to reliably prevent light from reflecting by the logic chip 12-1.

Figure 7:
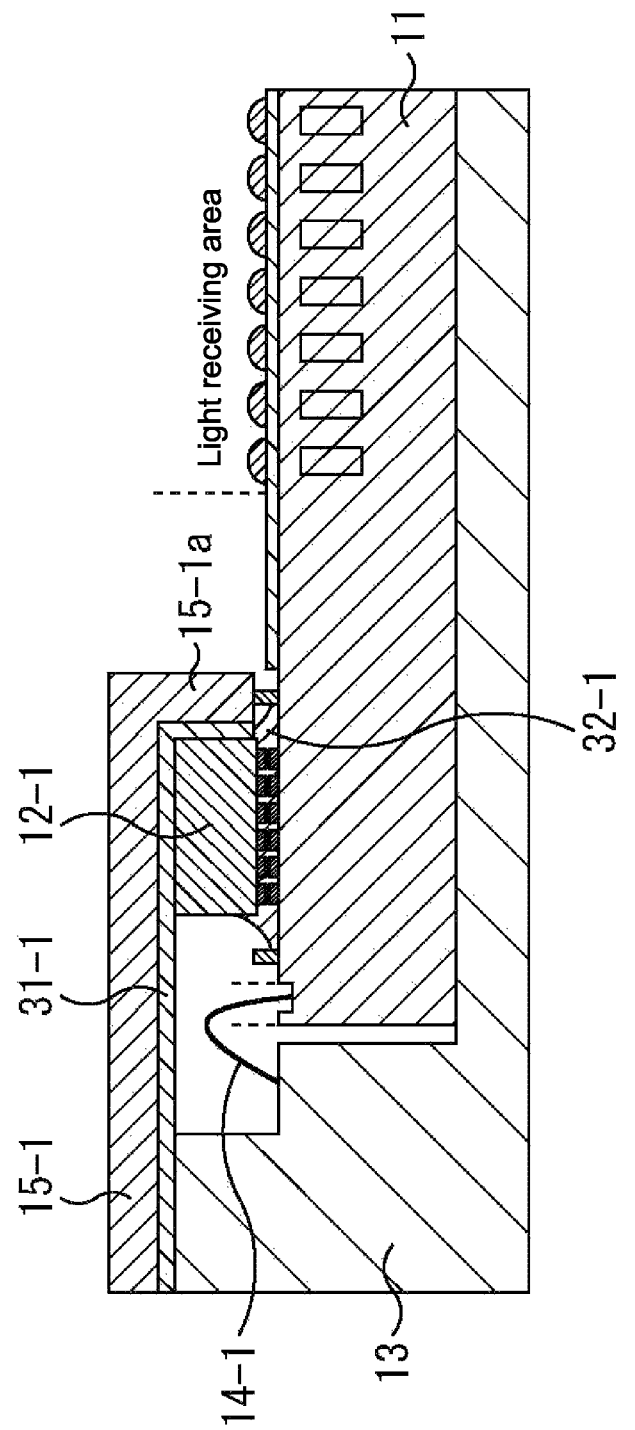
FIG. 7 is a diagram showing still another enlarged configuration of the left portion of FIG. 4.

Alternatively, the flare prevention plate 15-1 and the flare prevention plate 15-2 may be disposed as shown in FIG. 7.

In the example shown in FIG. 7, the end portion 15-1a of the flare prevention plate 15-1 on the side of the light receiving area (right side in FIG. 7) is bent downward at a right angle in FIG. 7. Specifically, in the case of FIG. 7, the film 31-1 on the end portion 15-1a of the flare prevention plate 15-1 on the side of the light receiving area is a surface of the logic chip 12-1, and is in contact with a surface perpendicular to the light-receiving surface of the image sensor chip 11. The configurations of other portions in FIG. 7 are same as those described above with reference to FIG. 5.

It should be noted that in this case, the end portion of the flare prevention plate 15-2 on the side of the light receiving area is bent downward at a right angle in FIG. 7, similarly.

In this way, it is possible to prevent light incident from the upper side in FIG. 7 from being applied to the logic chip 12-1 more reliably, and to reliably prevent light from reflecting by the logic chip 12-1.

Moreover, in this way, it is possible to accurately set the position of the end portion of the flare prevention plate 15-1 on the side of the light receiving area based on the position of the logic chip 12-1.

As described above, in the case of the semiconductor apparatus 10 to which the embodiment of the present disclosure is applied, the length of the chip is short as compared with that of the images sensor chip including a peripheral circuit. Specifically, because the distance between the logic chips 12-1 and 12-2 and the light receiving area is shortened, light may be prevented from being incident on the light receiving area if the end portion of the flare prevention plate 15-1 on the side of the light receiving area extremely protrudes to the side of the light receiving area. On the other hand, if the end portion of the flare prevention plate 15-1 on the light receiving area does not protrude to the side of the light receiving area, light incident from the upper side in FIG. 7 may be applied to the logic chip 12-1 and reflected by the logic chip 12-1.

As shown in FIG. 7, because the end portion of the flare prevention plate 15-1 on the light receiving area is bent downward at a right angle in FIG. 7, it is possible to prevent the logic chip 12-1 from being erroneously disposed to protrude extremely or not to protrude.

Figure 8:
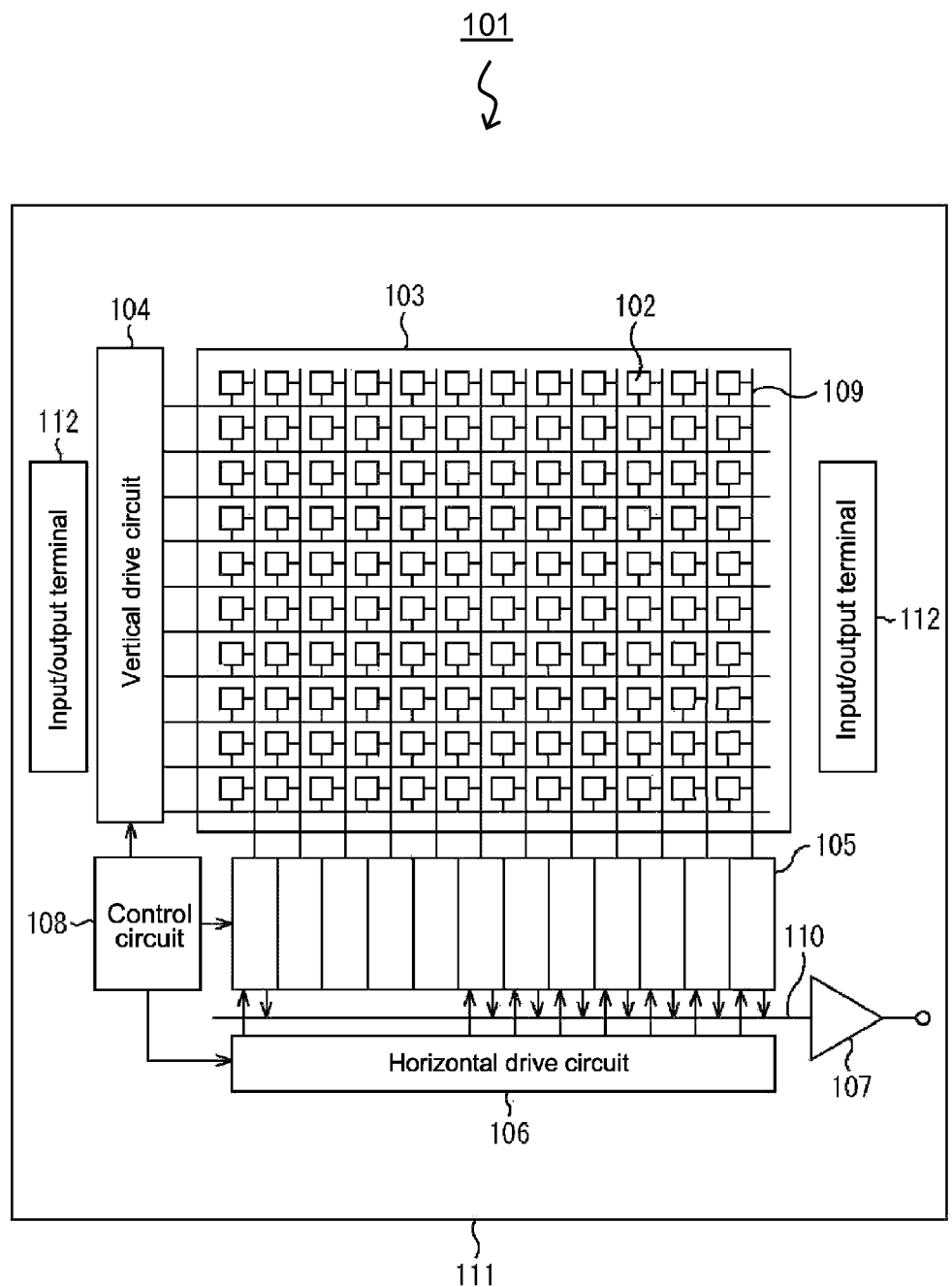
FIG. 8 is a block diagram showing a schematic functional configuration of a semiconductor apparatus to which the embodiment of the present disclosure is applied.

FIG. 8 is a block diagram showing a schematic functional configuration of the semiconductor apparatus 10 to which the embodiment of the present disclosure is applied. Here, the semiconductor apparatus 10 includes a CMOS (complementary metal oxide semiconductor) image sensor 101, for example.

The CMOS image sensor 101 shown in FIG. 8 includes a pixel area (so-called pixel array) 103 in which pixels 102 including a plurality of photoelectric conversion units are regularly arranged in a two-dimensional array on a semiconductor substrate 111, and a peripheral circuit portion.

Here, the pixel area 103 is configured as the light receiving area of the image sensor chip 11.

The peripheral circuit portion includes a vertical drive circuit 104, column signal processing circuits 105, a horizontal drive circuit 106, an output circuit 107, a control circuit 108, and the like.

The peripheral circuit portion including these circuits is configured as the logic chip 12-1 or the logic chip 12-2.

The control circuit 108 receives an input clock and data for commanding an operation mode or the like, and outputs data such as internal information of the CMOS image sensor 101. Specifically, the control circuit 108 generates a clock signal or a control signal, which is a reference of the operation of the vertical drive circuit 104, the column signal processing circuits 105, the horizontal drive circuit 106, or the like, based on a vertical synchronous signal, a horizontal synchronous signal, and a master clock. Then, the control circuit 108 inputs these signals to the vertical drive circuit 104, the column signal processing circuits 105, the horizontal drive circuit 106, or the like.

The vertical drive circuit 104 includes a shift register, for example, selects a pixel driving wiring, supplies a pulse for driving a pixel to the selected pixel driving wiring, and drives pixels row by row. Specifically, the vertical drive circuit 104 selectively scans the pixels 102 in the pixel area 103 row by row in a vertical direction sequentially, and supplies, to the column signal processing circuits 105, a pixel signal based on a signal charge generated depending on the amount of received light in the photoelectric conversion unit of each pixel 102 through a vertical signal line 109.

The column signal processing circuits 105 are disposed for each column of the pixels 102, and perform signal processing such as noise removal on a signal, which is output from a row of the pixels 102, for each pixel column, for example. On the output stage of the column signal processing circuits 105, a horizontal selection switch (not shown) is provided to be connected between the column signal processing circuits 105 and a horizontal signal line 110.

The horizontal drive circuit 106 includes a shift register, for example, selects each of the column signal processing circuits 105 in series by outputting a horizontal scanning pulse sequentially, and causes each of the column signal processing circuits 105 to output a pixel signal to the horizontal signal line 110.

The output circuit 107 performs signal processing on signals sequentially supplied from each of the column signal processing circuits 105 through the horizontal signal line 110, and outputs the signals. For example, only buffering may be performed, or black level adjusting, column variation correction, various types of digital signal processing, or the like may be performed. An input/output terminal 112 exchanges signals with the outside.

Figure 9:
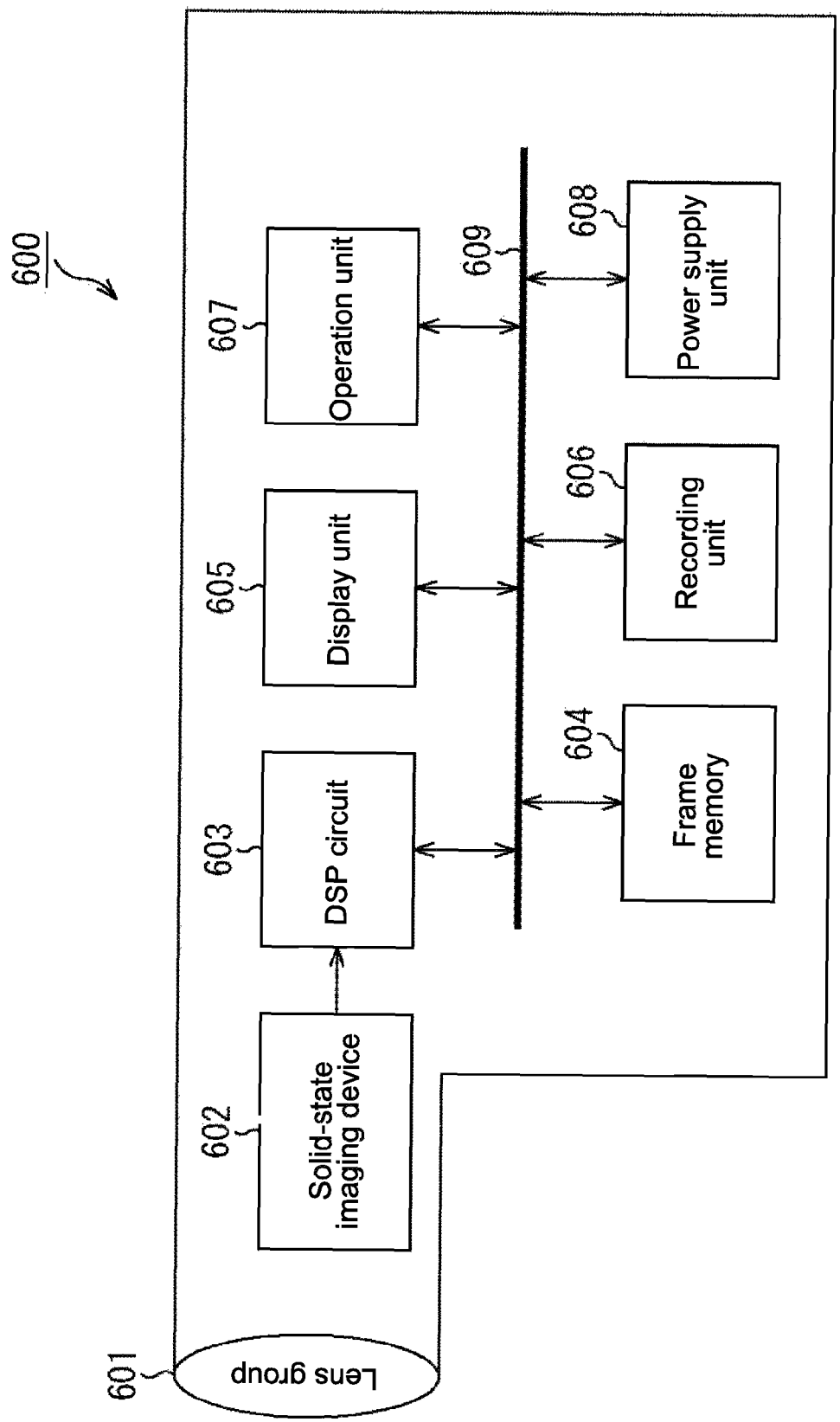
FIG. 9 is a block diagram showing a configuration example of a camera apparatus serving as an electronic apparatus to which an embodiment of the present disclosure is applied.

FIG. 9 is a block diagram showing a configuration example of a camera apparatus serving as an electronic apparatus to which an embodiment of the present disclosure is applied.

A camera apparatus 600 shown in FIG. 9 includes an optical unit 601 including a lens group or the like, a solid-state imaging device 602, and a DSP circuit 603 being a camera signal processing circuit. Moreover, the camera apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to each other via a bus line 609.

The optical unit 601 captures light incident from an object (image light), and forms an image on an imaging surface of the solid-state imaging device 602. The solid-state imaging device 602 converts the amount of incident light imaged on the imaging surface by the optical unit 601 into an electric signal for each pixel, and outputs the electric signal as a pixel signal. As the solid-state imaging device 602, the CMOS image sensor 101 according to the embodiment described above can be used.

The display unit 605 includes a panel display apparatus such as a liquid crystal panel and an organic EL (Electro Luminescence) panel, and displays a movie or a still image taken by the solid-state imaging device 602.

The recording unit 606 records a movie or a still image taken by the solid-state imaging device 602 in a recoding medium such as a video tape and a DVD (Digital Versatile Disk).

The operation unit 607 gives an operation command with respect to various functions of the camera apparatus 600 under the operation performed by a user. The power supply unit 608 appropriately supplies various types of power supplies to be operational power supplies of the DSP circuit 603, the frame memory 604, the display unit 605, the recording unit 606, and the operation unit 607, to the supply targets.

Moreover, the application of the present disclosure is not limited to a solid-state image sensor that detects distribution of the amount of incident visible light and images the distribution as an image, and the present disclosure can be applied to a solid-state image sensor that images the distribution of the incident amount of infrared rays, X-rays, particles, or the like as an image, and a general solid-state image sensor (physical amount distribution detection apparatus) such as a fingerprint detection sensor that detects distribution of another physical amount, e.g., pressure and capacitance, and images the distribution as an image, in a broad sense.

Moreover, embodiments of the present disclosure are not limited to the above-mentioned embodiments and various modifications can be made without departing from the gist of the present disclosure.

It should be noted that the present disclosure may also take the following configurations.

(1) A semiconductor apparatus, including:
a first semiconductor chip on which a photoelectric conversion unit configured to perform photoelectric conversion on light received in a light receiving area is formed;
a second semiconductor chip electrically connected to the first semiconductor chip, the second semiconductor chip being disposed on a surface of the first semiconductor chip on a side of the light receiving area; and
a flare prevention plate disposed on the second semiconductor chip, the flare prevention plate being configured to block light, the flare prevention plate being in contact with the second semiconductor chip.

(2) The semiconductor apparatus according to (1), in which an end portion of the flare prevention plate on a side of the light receiving area is disposed so as to protrude from an end portion of the second semiconductor chip on a side of the light receiving area by not less than 200 μm.

(3) The semiconductor apparatus according to (1), in which an end portion of the flare prevention plate on a side of the light receiving area is bent obliquely downward.

(4) The semiconductor apparatus according to (1), in which an end portion of the flare prevention plate on a side of the light receiving area is bent downward at a right angle.

(5) The semiconductor apparatus according to any one of (1) to (4), in which
a film of one of heat dissipating resin and a conductor for heat dissipation is formed on a surface of the flare prevention plate on a side where the flare prevention plate is in contact with the second semiconductor chip.

(6) An electronic apparatus, including
a semiconductor apparatus including
a first semiconductor chip on which a photoelectric conversion unit configured to perform photoelectric conversion on light received in a light receiving area is formed,
a second semiconductor chip electrically connected to the first semiconductor chip, the second semiconductor chip being disposed on a surface of the first semiconductor chip on a side of the light receiving area, and
a flare prevention plate disposed on the second semiconductor chip, the flare prevention plate being configured to block light, the flare prevention plate being in contact with the second semiconductor chip.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor apparatus, comprising:
a first semiconductor chip configured to include at least one photoelectric conversion unit to perform photoelectric conversion on light received in a light receiving area is formed;
a second semiconductor chip electrically connected to the first semiconductor chip; and
a flare prevention plate disposed on the first semiconductor chip, the flare prevention plate being configured to block light,
wherein a film of heat dissipating resin or a thermal conductor is disposed between the flare prevention plate and the first semiconductor chip,
wherein an end portion of the flare prevention plate on a side of the light receiving area is disposed so as to protrude from an end portion of the second semiconductor chip on a side of the light receiving area by not less than 200 pm.

2. The semiconductor apparatus according to claim 1, wherein
an end portion of the flare prevention plate on a side of the light receiving area is bent obliquely downward.

3. The semiconductor apparatus according to claim 1, wherein
an end portion of the flare prevention plate on a side of the light receiving area is bent downward at a right angle.

4. An electronic apparatus, comprising;
a semiconductor apparatus including:
a first semiconductor chip configured to include at least one photoelectric conversion unit to perform photoelectric conversion on light received in a light receiving area is formed;
a second semiconductor chip electrically connected to the first semiconductor chip; and
a flare prevention plate disposed on the first semiconductor chip, the flare prevention plate being configured to block light,
wherein a film of heat dissipating resin or a thermal conductor is disposed between the flare prevention plate and the first semiconductor chip,
wherein an end portion of the flare prevention plate on a side of the light receiving area is disposed so as to protrude from an end portion of the second semiconductor chip on a side of the light receiving area by not less than 200 pm.

5. The electronic apparatus according to claim 4, wherein an end portion of the flare prevention plate on a side of the light receiving area is bent obliquely downward.

6. The electronic apparatus according to claim 4, wherein an end portion of the flare prevention plate on a side of the light receiving area is bent downward at a right angle.

* * * * *